US010950501B2

(12) United States Patent
Younkin et al.

(10) Patent No.: US 10,950,501 B2
(45) Date of Patent: Mar. 16, 2021

(54) TRIBLOCK COPOLYMERS FOR SELF-ALIGNING VIAS OR CONTACTS

(71) Applicant: Intel Corporation, Santa Clara, CA (US)

(72) Inventors: Todd R. Younkin, Cary, NC (US); Eungnak Han, Portland, OR (US); Shane M. Harlson, Tigard, OR (US); James M. Blackwell, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 85 days.

(21) Appl. No.: 15/772,013

(22) PCT Filed: Dec. 21, 2015

(86) PCT No.: PCT/US2015/067203
§ 371 (c)(1),
(2) Date: Apr. 27, 2018

(87) PCT Pub. No.: WO2017/111926
PCT Pub. Date: Jun. 29, 2017

(65) Prior Publication Data
US 2018/0323104 A1    Nov. 8, 2018

(51) Int. Cl.
*H01L 21/768*      (2006.01)
*H01L 23/48*       (2006.01)
(Continued)

(52) U.S. Cl.
CPC ...... *H01L 21/76897* (2013.01); *G03F 7/0002* (2013.01); *G03F 7/0045* (2013.01);
(Continued)

(58) Field of Classification Search
CPC ........ G03F 7/0002; G03F 7/0045; G03F 7/16; H01L 23/48; H01L 23/532;
(Continued)

(56) References Cited

U.S. PATENT DOCUMENTS

| 8,426,313 B2* | 4/2013 | Millward ............ B81C 1/00031 438/700 |
| 2009/0233236 A1 | 9/2009 | Black et al. |

(Continued)

OTHER PUBLICATIONS

International Preliminary Report on Patentablity for International Patent Application No. PCT/US2015/067203—dated Jul. 5, 2018, 7 pages.

(Continued)

*Primary Examiner* — Sue A Purvis
*Assistant Examiner* — Scott Stowe
(74) *Attorney, Agent, or Firm* — Schwabe, Williamson & Wyatt, P.C.

(57) ABSTRACT

Fabrication schemes based on triblock copolymers for forming self-aligning vias or contacts for back end of line interconnects, and the resulting structures, are described. In an example, a method of fabricating an interconnect structure for a semiconductor die includes forming a lower metallization layer including alternating metal lines and dielectric lines above a substrate. The method also includes forming a triblock copolymer layer above the lower metallization layer. The method also includes segregating the triblock copolymer layer to form a first segregated block component over the dielectric lines of the lower metallization layer, and to form alternating second and third segregated block components disposed over the metal lines of the lower metallization layer, where the third segregated block component is photosensitive. The method also includes irradiating and developing select locations of the third (Continued)

segregated block component to provide via openings over the metal lines of the lower metallization layer.

20 Claims, 9 Drawing Sheets

(51) Int. Cl.
*H01L 23/532* (2006.01)
*G03F 7/00* (2006.01)
*G03F 7/004* (2006.01)
*G03F 7/16* (2006.01)
*H01L 21/027* (2006.01)

(52) U.S. Cl.
CPC ............ *G03F 7/16* (2013.01); *H01L 21/0274* (2013.01); *H01L 21/76816* (2013.01); *H01L 23/48* (2013.01); *H01L 23/532* (2013.01); *H01L 23/5329* (2013.01); *H01L 23/53295* (2013.01); *H01L 21/76807* (2013.01)

(58) Field of Classification Search
CPC ........... H01L 23/5329; H01L 23/53295; H01L 21/76897; H01L 21/0274
See application file for complete search history.

(56) References Cited

U.S. PATENT DOCUMENTS

| | | |
|---|---|---|
| 2011/0240596 A1 | 10/2011 | Millward |
| 2012/0013989 A1 | 1/2012 | Choi et al. |
| 2013/0230705 A1 | 9/2013 | Nealey et al. |
| 2013/0230981 A1* | 9/2013 | Kawamura ......... H01L 21/0272 438/637 |
| 2015/0093702 A1 | 4/2015 | Nyhus et al. |

OTHER PUBLICATIONS

International Search Report and Written Opinion for International Patent Application No. PCT/US2015/067203 dated Sep. 20, 2016, 10 pgs.

* cited by examiner

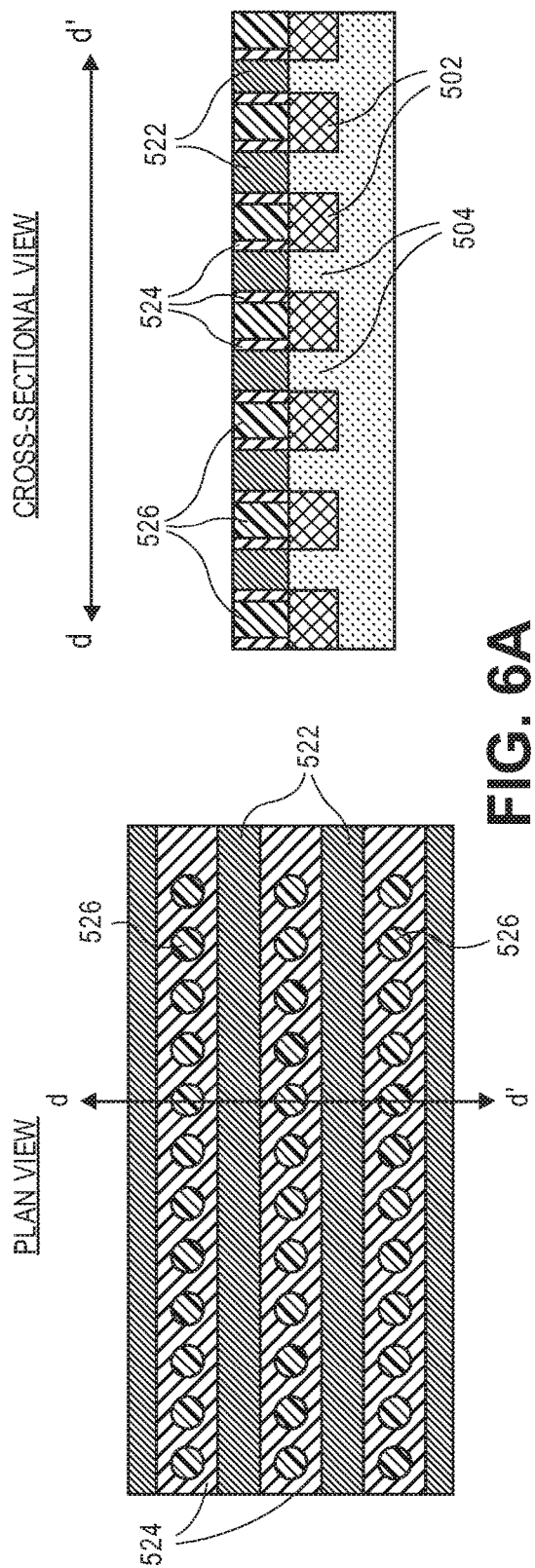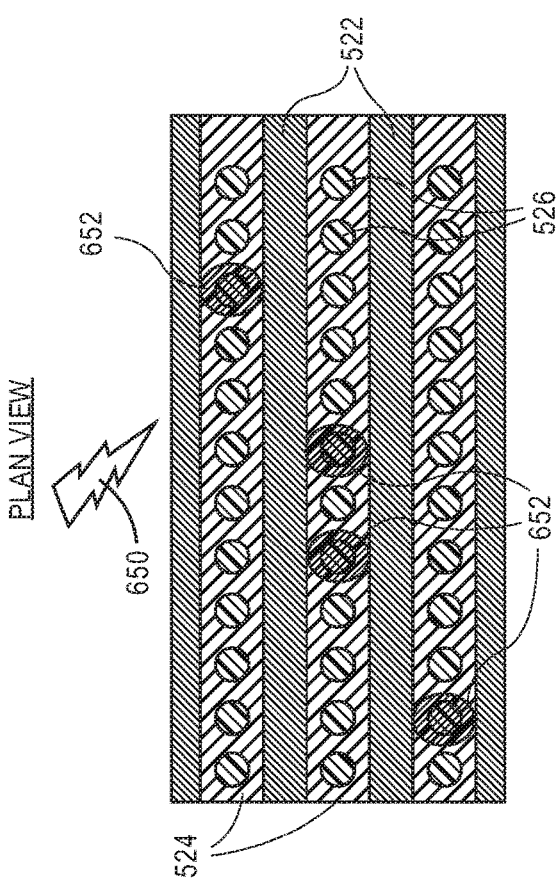
FIG. 6A
FIG. 6B

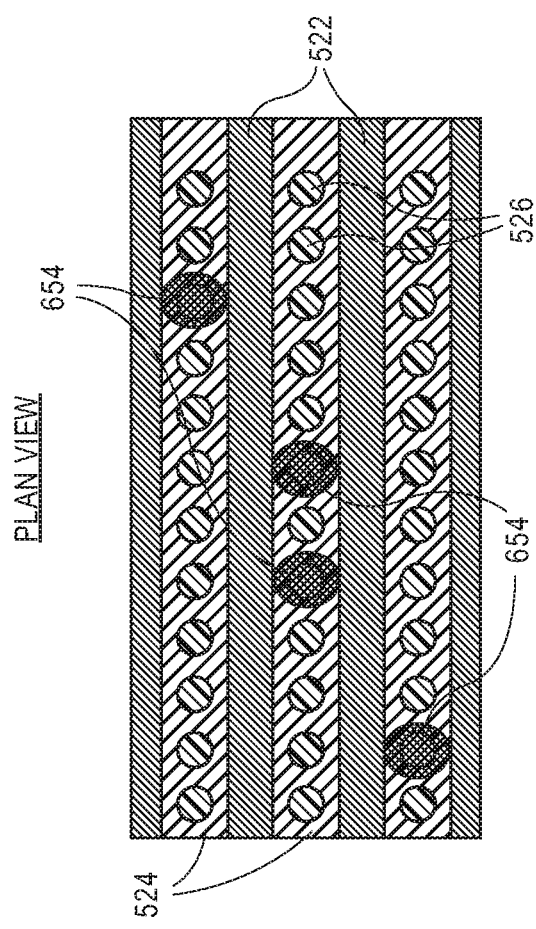
FIG. 6C
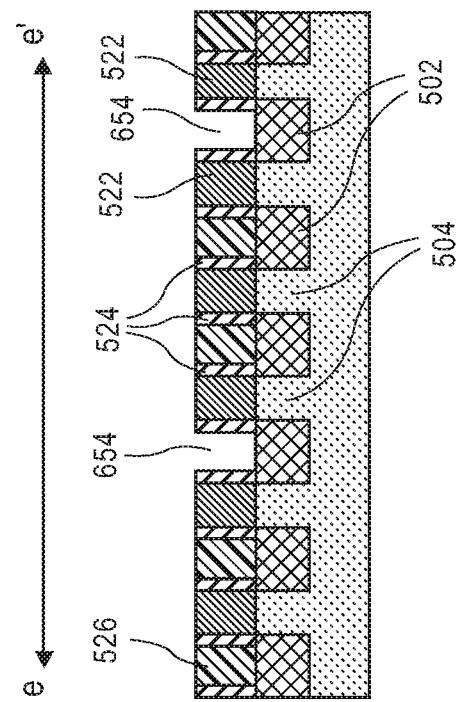
FIG. 6D
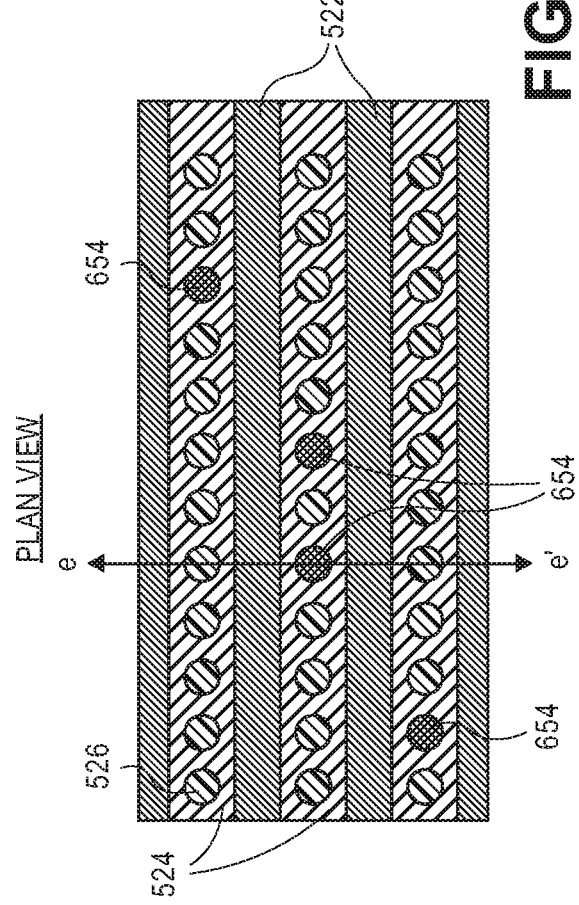

TRIBLOCK COPOLYMERS FOR SELF-ALIGNING VIAS OR CONTACTS

CROSS-REFERENCE TO RELATED APPLICATION

This patent application is a U.S. National Phase Application under 35 U.S.C. § 371 of International Application No. PCT/US2015/067203, filed Dec. 21, 2015, entitled "TRIBLOCK COPOLYMERS FOR SELF-ALIGNING VIAS OR CONTACTS," which designates the United States of America, the entire disclosure of which is hereby incorporated by reference in its entirety and for all purposes.

TECHNICAL FIELD

Embodiments of the invention are in the field of semiconductor structures and processing and, in particular, fabrication schemes based on triblock copolymers for forming self-aligning vias or contacts for back end of line (BEOL) interconnects, and the resulting structures.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Integrated circuits commonly include electrically conductive microelectronic structures, which are known in the arts as vias, to electrically connect metal lines or other interconnects above the vias to metal lines or other interconnects below the vias. Vias are typically formed by a lithographic process. Representatively, a photoresist layer may be spin coated over a dielectric layer, the photoresist layer may be exposed to patterned actinic radiation through a patterned mask, and then the exposed layer may be developed in order to form an opening in the photoresist layer. Next, an opening for the via may be etched in the dielectric layer by using the opening in the photoresist layer as an etch mask. This opening is referred to as a via opening. Finally, the via opening may be filled with one or more metals or other conductive materials to form the via.

In the past, the sizes and the spacing of vias has progressively decreased, and it is expected that in the future the sizes and the spacing of the vias will continue to progressively decrease, for at least some types of integrated circuits (e.g., advanced microprocessors, chipset components, graphics chips, etc.). One measure of the size of the vias is the critical dimension of the via opening. One measure of the spacing of the vias is the via pitch. Via pitch represents the center-to-center distance between the closest adjacent vias.

When patterning extremely small vias with extremely small pitches by such lithographic processes, several challenges present themselves, especially when the pitches are around 70 nanometers (nm) or less and/or when the critical dimensions of the via openings are around 35 nm or less. One such challenge is that the overlay between the vias and the overlying interconnects, and the overlay between the vias and the underlying landing interconnects, generally need to be controlled to high tolerances on the order of a quarter of the via pitch. As via pitches scale ever smaller over time, the overlay tolerances tend to scale with them at an even greater rate than lithographic equipment is able to keep up.

Another such challenge is that the critical dimensions of the via openings generally tend to scale faster than the resolution capabilities of the lithographic scanners. Shrink technologies exist to shrink the critical dimensions of the via openings. However, the shrink amount tends to be limited by the minimum via pitch, as well as by the ability of the shrink process to be sufficiently optical proximity correction (OPC) neutral, and to not significantly compromise line width roughness (LWR) and/or critical dimension uniformity (CDU).

Yet another such challenge is that the LWR and/or CDU characteristics of photoresists generally need to improve as the critical dimensions of the via openings decrease in order to maintain the same overall fraction of the critical dimension budget. However, currently the LWR and/or CDU characteristics of most photoresists are not improving as rapidly as the critical dimensions of the via openings are decreasing.

A further such challenge is that the extremely small via pitches generally tend to be below the resolution capabilities of even extreme ultraviolet (EUV) lithographic scanners. As a result, commonly two, three, or more different lithographic masks may be used, which tend to increase the costs. At some point, if pitches continue to decrease, it may not be possible, even with multiple masks, to print via openings for these extremely small pitches using EUV scanners.

Thus, improvements are needed in the area of via manufacturing technologies.

BRIEF DESCRIPTION OF THE DRAWINGS

FIGS. 6A-6D illustrate plan views and corresponding cross-sectional views representing various operations in a method using triblock copolymers for forming self-aligning vias or contacts for back end of line (BEOL) interconnects, in accordance with an embodiment of the present invention.

DESCRIPTION OF THE EMBODIMENTS

Fabrication schemes based on triblock copolymers for forming self-aligning vias or contacts for back end of line (BEOL) interconnects, and the resulting structures, are described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments described herein are directed to triblock copolymers for self-aligning vias or contacts. Through the use of more advanced block copolymers and a directed self-assembly strategy, alignment to an underlying tight metal layer can be achieved. Since a triblock copolymer material has three phases, it can be effected to phase separate into "self-aligned photobuckets." Embodiments described herein may be implemented to improve cost, scalability, pattern placement error, and variability. In an embodiment, the use of a self-aligning triblock copolymer to generate aligned photobuckets is described.

To provide context for embodiments described below, issues associated with across die/wafer etch non-uniformity can reduce yield and/or performance of fabricated semiconductor structures. One or more embodiments described herein offer a more efficient approach to patterning by maximizing the overlay process window, minimizing the size and shape of required patterns, and increasing the efficiency of the lithography process to pattern holes (e.g., vias or contacts) or plugs.

Figure 1:
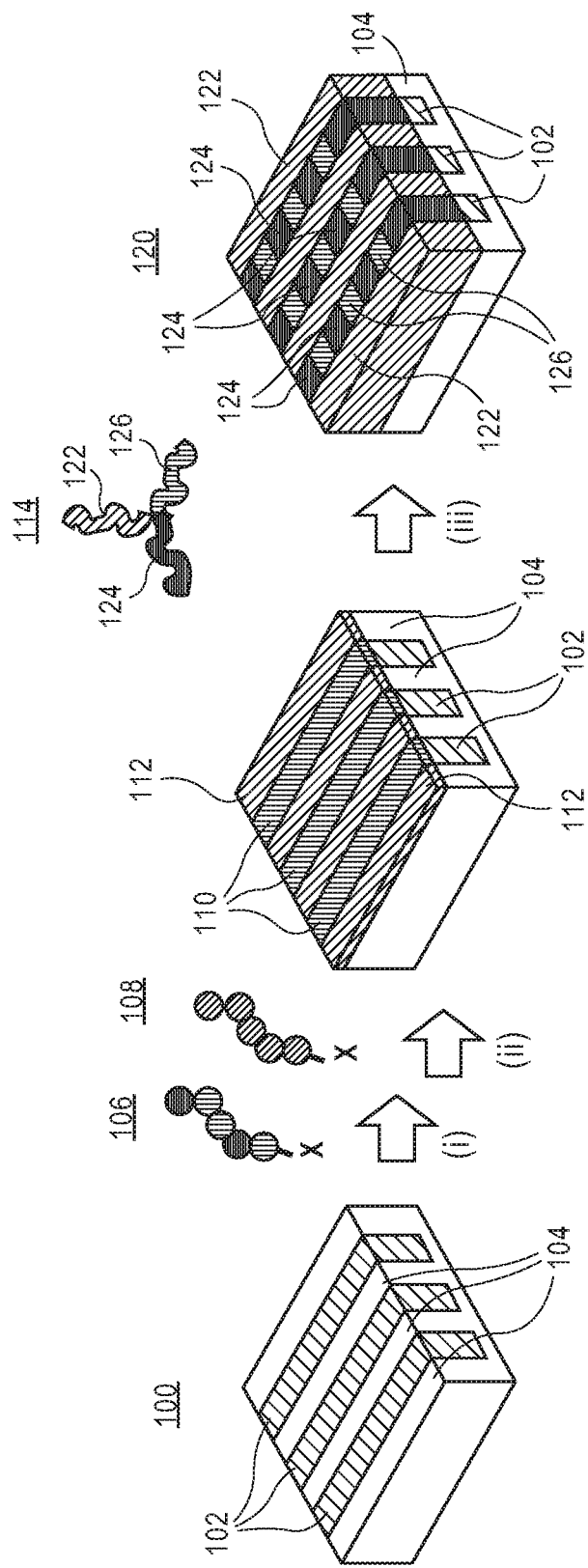
FIGS. 1A-1C illustrate angled cross-sectional views representing various operations in a method using triblock copolymers for forming self-aligning vias or contacts for back end of line (BEOL) interconnects, in accordance with an embodiment of the present invention.

FIGS. 1A-1C illustrate angled cross-sectional views representing various operations in a method using triblock copolymers for forming self-aligning vias or contacts for back end of line (BEOL) interconnects, in accordance with an embodiment of the present invention.

Referring to FIG. 1A, a semiconductor structure layer 100 has a grating pattern of alternating metal lines 102 and interlayer dielectric (ILD) lines 104. The structure 100 may be treated with a first molecular brush operation (i) with first molecular species 106. The structure 100 may also be treated with a second molecular brush operations (ii) with second molecular species 108. It is to be appreciated that the order of operations (i) and (ii) may be reversed, or may even be performed at substantially the same time. derivative metal surface and ILD surface with brushes Referring to FIG. 1B, the molecular brush operations may be performed to alter or provide a derivative surface for the alternating metal lines 102 and ILD lines 104. For example, the surface of metal lines 102 may be treated to have an A/B surface 110 on metal lines 102. The surface of ILD lines 104 may be treated to have a C surface 112 on ILD lines 104.

Referring to FIG. 1C, the structure of FIG. 1B may be treated with a treatment operation (iii) which involves application of a triblock block copolymer (triblock BCP) 114, and possible subsequent segregating treatment, to form a segregated structure 120. Segregated structure 120 includes first regions 122 of a segregated triblock BCP above the ILD lines 104. Alternating second regions 124 and third regions 126 of the segregated triblock BCP are above the metal lines 102. The ultimate arrangement of the three blocks of the triblock copolymer 114 is based on chemo-epitaxy since only an underlying pattern (and not a co-planar pattern, as is used in grapho-epitaxy) is used to direct the assembly of the triblock copolymer 114 to form the segregated structure 120.

Referring collectively to FIGS. 1A-1C, in an embodiment, a structure 120 for directed self-assembly of a back end of line (BEOL) semiconductor structure metallization layer includes a substrate (not shown, but described below, and to be appreciated as being below ILD lines 104 and metal lines 102)). A lower metallization layer includes alternating metal lines 102 and dielectric lines 104 disposed above the substrate. A triblock copolymer layer 114 is disposed above the lower metallization layer. The triblock copolymer layer includes a first segregated block component 122 disposed over the dielectric lines 104 of the lower metallization layer. The triblock copolymer layer includes alternating second 124 and third 126 segregated block components disposed over the metal lines 102 of the lower metallization layer.

In an embodiment, the third segregated block 126 component of the triblock copolymer layer 114 is photosensitive. In an embodiment, the triblock copolymer layer 114 is formed to a thickness approximately in the range of 5-100 nanometers. In an embodiment, the triblock copolymer layer 114 includes a triblock copolymer species selected from the group consisting of any three of poly-styrene and other polyvinylarenes, polyisoprene and other polyolefins, poly-methacrylate and other poly-esters, polydimethylsiloxane (PDMS) and related Si-based polymers, polyferrocenylsilanes, polyethyelene oxide (PEO) and related poly-ethers and poly-vinylpyridine. In one embodiment, the alternating second 124 and third 126 segregated block components have a ratio of approximately 1:1, as is depicted in FIG. 1C (and as is described below in association with FIG. 5B). In another embodiment, the alternating second 124 and third 126 segregated block components have a ratio of X:1, second segregated block component 124 to third segregated block component 126, where X is greater than 1, and where the third segregated block component 126 has a columnar structure surrounded by the second segregated block component, as is described below in association with FIG. 6A. In another embodiment, the triblock copolymer layer 114 is a blend of homopolymers of A, B, and/or C or diblock BCPs of the A-B, B-C, or A-C components in order to achieve the desired morphology.

In an embodiment, the structure 120 further includes a first molecular brush layer 112 disposed on the dielectric lines 104 of the lower metallization layer. In that embodiment, the first segregated block component 122 is disposed on the first molecular brush layer. In an embodiment, the structure 120 also includes a second, different, molecular brush layer 110 disposed on the metal lines 102 of the lower metallization layer. The alternating second 124 and third 126 segregated block components are disposed on the second molecular brush layer 110. In one embodiment, the first molecular brush layer 112 includes a molecular species 108 including polystyrene with a head group selected from the group consisting of —SH, —PO$_3$H$_2$, —CO$_2$H, —NRH, —NRR', and —Si(OR)$_3$, and the second molecular brush layer 110 includes a molecular species 106 including polymethacrylate with a head group selected from the group consisting of —SH, —PO$_3$H$_2$, —CO$_2$H, —NRH, —NRR', and —Si(OR)$_3$.

In an embodiment, the alternating metal lines 102 and dielectric lines 104 of the lower metallization layer have a grating pattern with a constant pitch. In an embodiment, the third segregated block component 126 of the triblock copolymer layer 114 defines all possible via locations for a metallization layer above the lower metallization layer. In an embodiment, the third segregated block component 126 of the triblock copolymer layer 114 is photosensitive to an extreme ultra-violet (EUV) source or an e-beam source.

Figure 2:
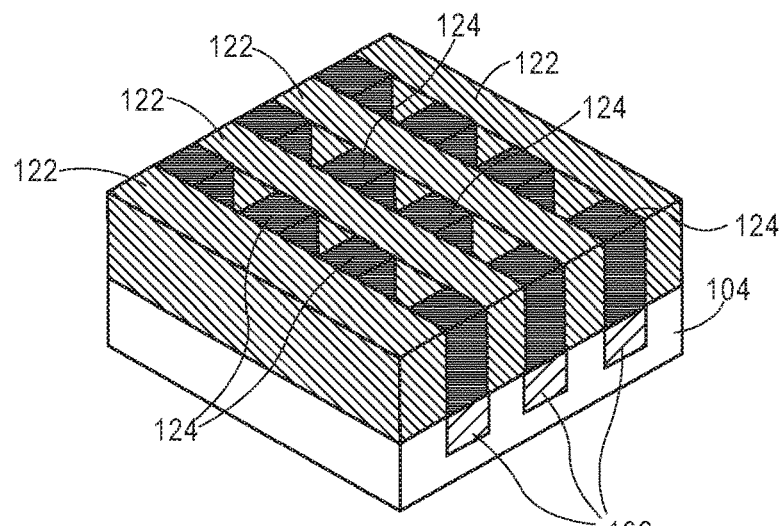
FIG. 2 illustrates an angled cross-sectional view representing an operation in a method using triblock copolymers for forming self-aligning vias or contacts for back end of line (BEOL) interconnects, in accordance with an embodiment of the present invention.

FIG. 2 illustrates an angled cross-sectional view representing an operation in a method using triblock copolymers for forming self-aligning vias or contacts for back end of line (BEOL) interconnects, in accordance with an embodiment of the present invention.

Referring to FIG. 2, all portions of the third segregated block component 126 of the structure 120 of FIG. 1C are removed. In one such embodiment, the removal of all portions of the third segregated block component 126 opens all possible via locations that may be formed above the underlying metallization later. The openings may be filled with a photoresist layer to ultimately allow for selection of only those via locations need for a particular design. It is to be appreciated that, in the case of FIG. 2, the third segregated block component 126 of the structure 120 may be, but need not be, photosensitive, since the removal of all portions of the third segregated block component 126 of the structure 120 of FIG. 1C may be performed by selective etching alone (e.g., selective to first segregated block component 122 and to second segregated block component 124). In one such embodiment, the selective etching may be performed using a selective dry etch or a selective wet etch, or both.

Figure 3:
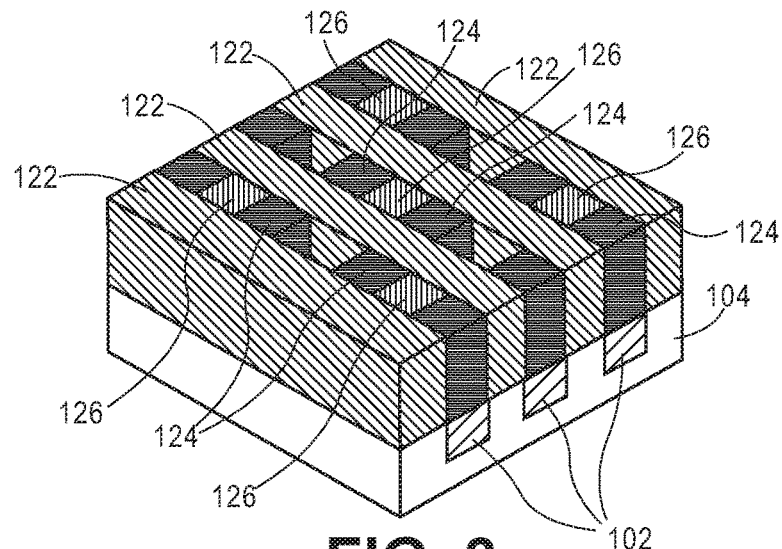
FIG. 3 illustrates an angled cross-sectional view representing an operation in another method using triblock copolymers for forming self-aligning vias or contacts for back end of line (BEOL) interconnects, in accordance with another embodiment of the present invention.

FIG. 3 illustrates an angled cross-sectional view representing an operation in another method using triblock copolymers for forming self-aligning vias or contacts for back end of line (BEOL) interconnects, in accordance with another embodiment of the present invention.

Referring to FIG. 3, only select portions of the third segregated block component 126 of the structure 120 of FIG. 1C are removed. In one such embodiment, the removal of only select portions of the third segregated block component 126 only those via locations above the underlying metallization layer needed for a particular design. It is to be appreciated that, in the case of FIG. 3, the third segregated block component 126 of the structure 120 is photosensitive, and location selection is performed using localized, but highly tolerant lithographic exposure. The exposure may be described as tolerant since neighboring materials 122 and 124 adjacent locations 126 are, in one embodiment, not photosensitive to the lithography used to select the locations for portions of removal of component 126.

Figure 4:
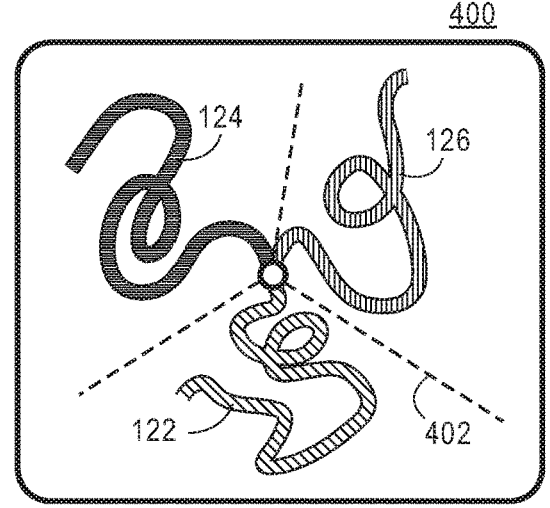
FIG. 4 illustrates a triblock copolymer for forming self-aligning vias or contacts for back end of line (BEOL) interconnects, in accordance with an embodiment of the present invention.

FIG. 4 illustrates a triblock copolymer for forming self-aligning vias or contacts for back end of line (BEOL) interconnects, in accordance with an embodiment of the present invention.

Referring to FIG. 4, a segregated triblock BCP 400 may be partitioned along axis 402 by portions 122, 124, 126. It is to be appreciated that other partitioning arrangements may be possible, such as asymmetrical arrangements. In an embodiment, there is etch selectivity between components 122, 124 and 126, which may be a s great as 10:1 etch selectivity for one component relative to the other two components. In an embodiment, the use of triblock BCP 400 can improve pattern fidelity and reduce critical dimension (CD) variation at dimensions less than approximately 60 nanometers. In an embodiment, the segregated triblock BCP 400 can be implemented to enable a self-aligning strategy that complements a 193 nanometer immersion lithography (193i) or an extreme ultraviolet lithography (EUVL) process.

It is to be appreciated that, typically, the blocks of triblock copolymers may each have different chemical properties. As one example, one of the blocks may be relatively more hydrophobic (e.g., water repelling) while the two blocks may be relatively more hydrophilic (water attracting), or vice versa. At least conceptually, one of the blocks may be relatively more similar to oil and the other two blocks may be relatively more similar to water, or vice versa. Such differences in chemical properties between the different blocks of polymers, whether a hydrophilic-hydrophobic difference or otherwise, may cause the block copolymer molecules to self-assemble. For example, the self-assembly may be based on microphase separation of the polymer blocks. Conceptually, this may be similar to the phase separation of oil and water which are generally immiscible.

Similarly, differences in hydrophilicity between the polymer blocks may cause a roughly analogous microphase separation where the different polymer blocks try to "separate" from each other due to chemical dislike for one another. However, in an embodiment, since the polymer blocks are covalently bonded to one another, they cannot completely separate on a macroscopic scale. Rather, polymer blocks of a given type may tend to segregate or conglomerate with polymer blocks of the same type of other molecules in extremely small (e.g., nano-sized) regions or phases. The particular size and shape of the regions or microphases generally depends at least in part upon the relative lengths of the polymer blocks. In an embodiment, by way of example, FIGS. 1C, 5B and 6A depict possible assembly schemes for a triblock copolymer.

One or more embodiments described herein are directed to an approach that employs an underlying metal as a template to build the conductive vias. It is to be appreciated that similar approaches may be implemented to fabricate non-conductive spaces or interruptions between metals (referred to as "plugs"). Vias, by definition, are used to land on a previous layer metal pattern. In this vein, embodiments described herein enable a more robust interconnect fabrication scheme since alignment by lithography equipment is no longer relied on. Such an interconnect fabrication scheme can be used to save numerous alignment/exposures, can be used to improve electrical contact (e.g., by reducing via resistance), and can be used to reduce total process operations and processing time otherwise required for patterning such features using conventional approaches. One or more embodiment described herein involves the pre-forming of every possible via opening location. An additional selection operation is then used to select which of the vias to retain. Such operations are illustrated herein using "photobuckets," although the selection process may also be performed using a more conventional resist expose and ILD backfill approach.

It is to be appreciated that a pattern needed to open a pre-formed via or plug location can be made to be relatively small, enabling an increase in the overlay margin of a lithographic process. The pattern features can be made of uniform size, which can reduce scan time on direct write ebeam and/or optical proximity correction (OPC) complexity with optical lithography. The pattern features can also be made to be shallow, which can improve the patterning resolution. A subsequently performed etch process may be an isotropic chemically selective etch. Such an etch process mitigates otherwise associated with profile and critical dimension and mitigates anisotropic issues typically associated with dry etch approaches. Such an etch process is also relatively much less expensive from an equipment and throughput perspective as compared to other selective removal approaches.

In an exemplary embodiment, as mentioned briefly above, approaches described herein build on the use of so-called "photobuckets," in which every possible feature, e.g. via or plug, is re-patterned into a substrate. Then, a photoresist is filled into patterned features and the lithography operation is merely used to choose select vias for via opening formation. The photobucket approach allows for larger critical dimensions (CD)s and/or errors in overlay while retaining the ability to choose the via or plug of interest. Lithographic approaches for selecting particular photobuckets may include, but may not be limited to, 193 nm immersion lithography (i193), extreme ultra-violet (EUV) and/or e-beam direct write (EBDW) lithography. It is also to be appreciated that embodiments are not limited to the concept of photobuckets, but have far reaching applications to structures having pre-formed features fabricated using bottom-up and/or directed self-assembly (DSA) approached.

Overall, in accordance with an embodiment of the present invention, a DSA approach is rendered as photosensitive. In one view, a form of photobuckets is achieved where lithographic constraints may be relaxed and misalignment tolerance may be high since the photobucket is surrounded by non-photolyzable materials. Furthermore, in an embodiment, instead of exposing at, e.g. 30 mJ/cm2, such a photobucket might be exposed at, e.g., 3 mJ/cm2. Normally this would result in very poor CD control and roughness. But in this case, the CD and roughness control will be defined by the photobucket geometry, which can be very well controlled and defined. Thus, such a photobucket approach may be used to circumvent imaging/dose tradeoff which limits the throughput of next generation lithographic processes.

The following describes portions of integrated circuit layers representing various operations in a method of self-aligned via and metal patterning. In particular, FIGS. 5A and 5B illustrate plan views and corresponding cross-sectional views representing various operations in a method using triblock copolymers for forming self-aligning vias or contacts for back end of line (BEOL) interconnects, in accordance with an embodiment of the present invention.

Figure 5A:
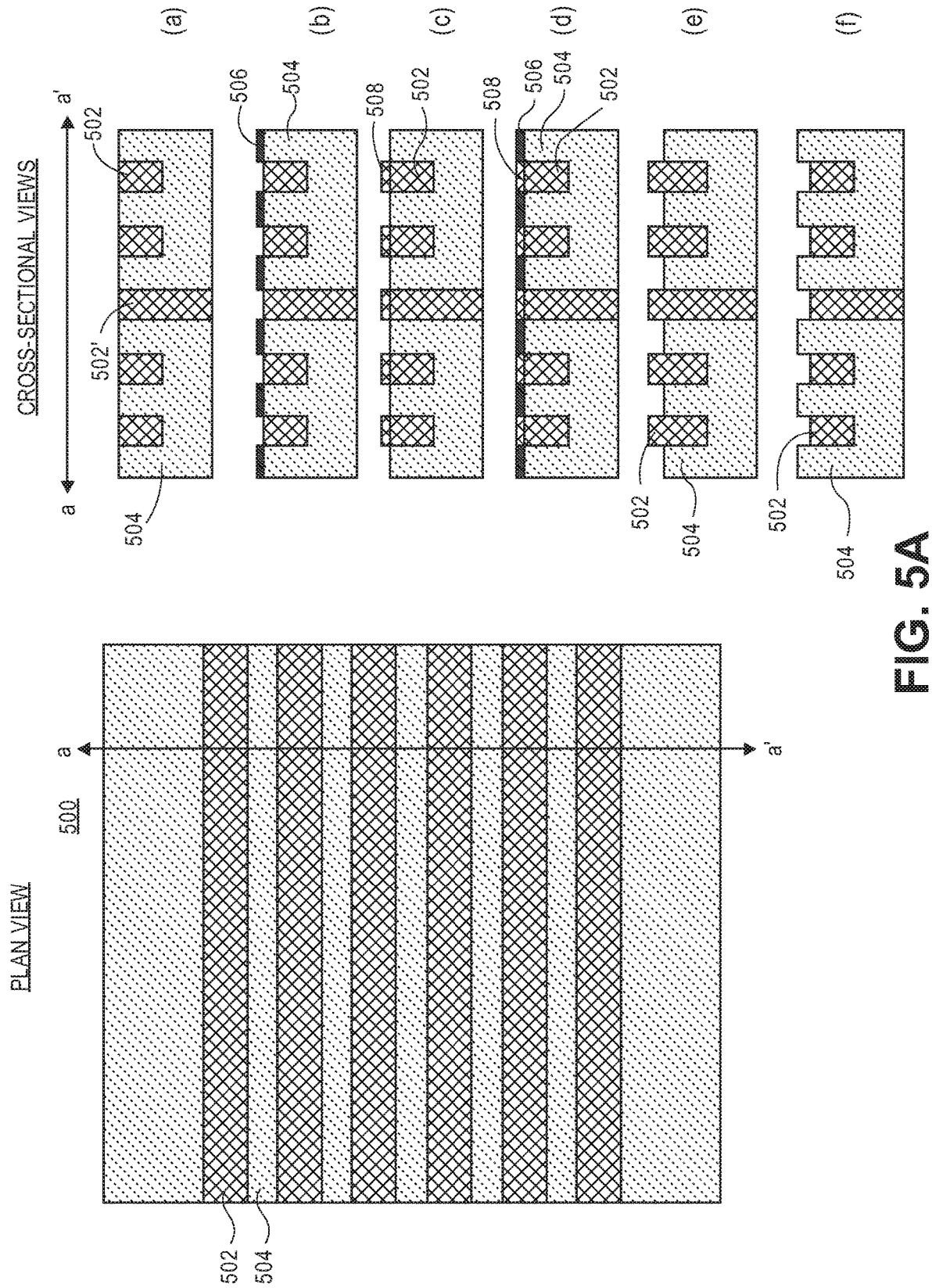
FIGS. 5A and 5B illustrate plan views and corresponding cross-sectional views representing various operations in a method using triblock copolymers for forming self-aligning vias or contacts for back end of line (BEOL) interconnects, in accordance with an embodiment of the present invention.
Figure 5B:
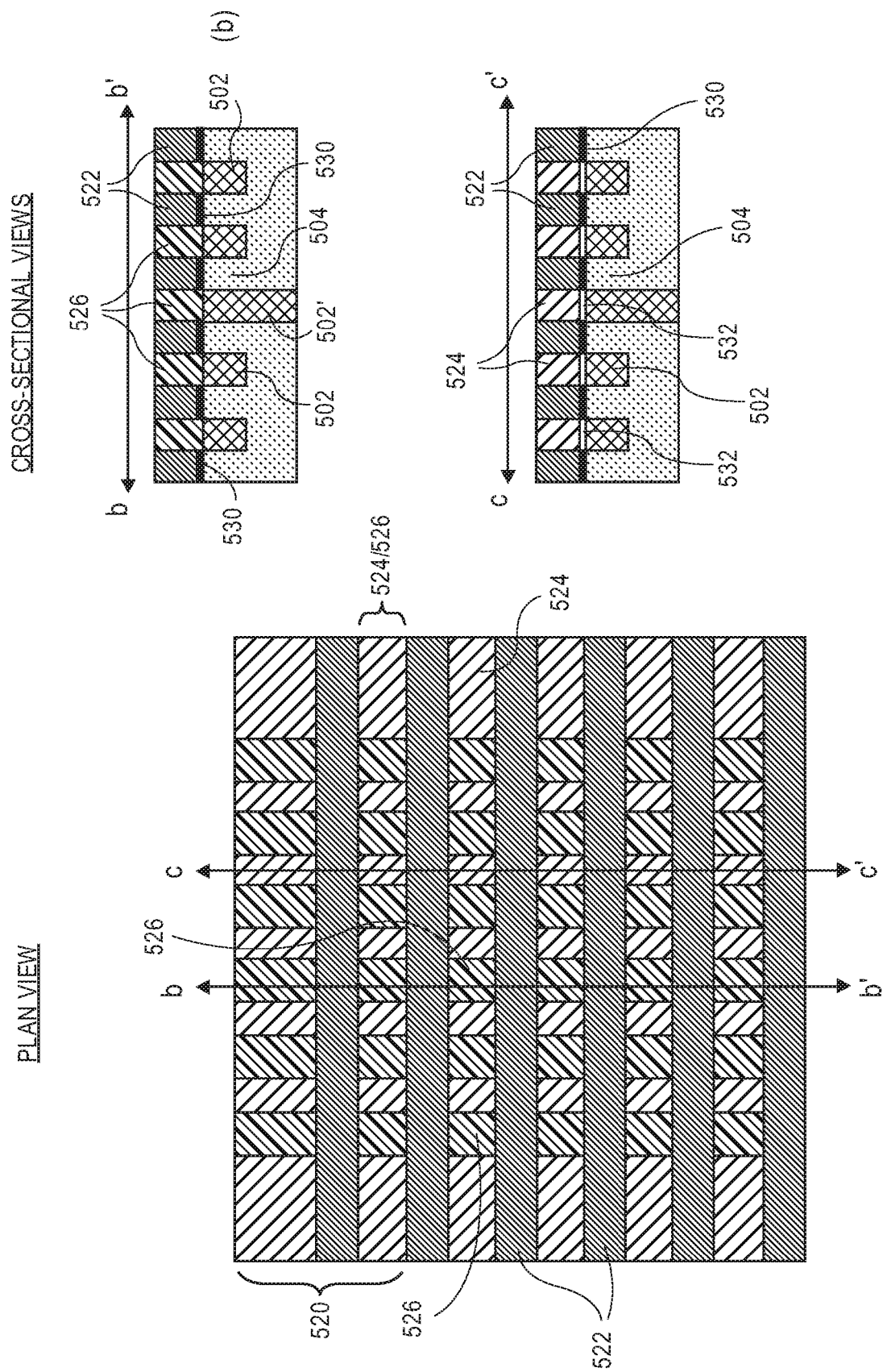

FIG. 5A illustrates a plan view and corresponding cross-sectional views taken along the a-a' axis of options for a previous layer metallization structure, in accordance with an embodiment of the present invention. Referring to the plan view and corresponding cross-section view option (a), a starting structure 500 includes a pattern of metal lines 502 and interlayer dielectric (ILD) lines 504. The starting structure 500 may be patterned in a grating-like pattern with metal lines spaced at a constant pitch and having a constant width, as is depicted in FIG. 5A in the case that self-assembling materials are ultimately formed thereon. In the case of cross-sectional view (a), the pattern of metal lines 502 and interlayer dielectric (ILD) lines 504 are planar with one another. Some of the lines may be associated with underlying vias, such as line 502' shown as an example in the cross-sectional views.

Referring again to FIG. 5A, alternative options (b)-(f) address situations where an additional film is formed (e.g., deposited, grown, or left as an artifact remaining from a previous patterning process) on a surface of one of, or both of, the metal lines 502 and interlayer dielectric lines 504. In example (b), an additional film 506 is disposed on the interlayer dielectric lines 504. In example, (c), an additional film 508 is disposed on the metal lines 502. In example, (d) an additional film 506 is disposed on the interlayer dielectric lines 504, and an additional film 508 is disposed on the metal lines 502. Furthermore, although the metal lines 502 and the interlayer dielectric lines 504 are depicted as co-planar in (a), in other embodiments, they are not co-planar. For example, in (e), the metal lines 502 protrude above the interlayer dielectric lines 504. In example, (0, the metal lines 502 are recessed below the interlayer dielectric lines 504.

Referring again to examples (b)-(d), an additional layer (e.g., layer 506 or 508) can be used as a hardmask (HM) or protection layer or be used to enable self-assembly described below in association with subsequent processing operations. Such additional layers may also be used to protect the ILD lines from further processing. In addition, selectively depositing another material over the metal lines may be beneficial for similar reasons. Referring again to examples (e) and (f), it may also be possible to recess either the ILD lines or the metal lines with any combination of protective/HM materials on either or both surfaces. Overall, there exist numerous options at this stage for preparing ultimately underlying surfaces for a directed self-assembly process.

In an embodiment, as used throughout the present description, interlayer dielectric (ILD) material, such as the material of the interlayer dielectric lines 504, is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, interconnect material, such as the material of metal lines 502, is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers, stacks of different metals or alloys, etc. The interconnect lines are also sometimes referred to in the arts as traces, wires, lines, metal, or simply interconnect. As will be described further below, top surfaces of the lower interconnect lines may be used for self-aligned via and plug formation.

In an embodiment, as is also used throughout the present description, hardmask materials, such, as layers 506 or 508 if included as a hardmask, are composed of dielectric materials different from the interlayer dielectric material. In one embodiment, different hardmask materials may be used in different regions so as to provide different growth or etch selectivity to each other and to the underlying dielectric and metal layers. In some embodiments, a hardmask layer includes a layer of a nitride of silicon (e.g., silicon nitride) or a layer of an oxide of silicon, or both, or a combination thereof. Other suitable materials may include carbon-based materials. In another embodiment, a hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other hardmask layers known in the arts may be used depending upon the particular implementation. The hardmask layers maybe formed by CVD, PVD, or by other deposition methods.

It is to be appreciated that the layers and materials described in association with FIG. 5A are typically formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structure depicted in FIG. 5A may be fabricated on underlying lower level interconnect layers.

As described above, patterned features may be patterned in a grating-like pattern with lines, holes or trenches spaced at a constant pitch and having a constant width. The pattern, for example, may be fabricated by a pitch halving or pitch quartering approach. In an example, a blanket film is patterned using lithography and etch processing which may involve, e.g., spacer-based-quadruple-patterning (SBQP) or pitch quartering. It is to be appreciated that a grating pattern of lines can be fabricated by numerous methods, including 193 nm immersion litho (i193), EUV and/or EBDW lithography, directed self-assembly, etc.

Referring to FIG. 5B, a triblock copolymer layer 520 is formed on the structure of FIG. 5A (e.g., plan view and cross-sectional structure (a)). The triblock copolymer layer 520 is segregated to have regions 522 formed above the ILD lines 504, and to have alternating second regions 524 and third regions 526 formed above metal lines 502.

Referring to the cross-sectional view along the b-b' axis of FIG. 5B, the third regions 526 are shown above the metal lines 502, and the first regions 522 are shown above the ILD lines 504. In accordance with one embodiment, also shown between first regions 522 and ILD lines 504 is layer 530 which may be a remnant of a molecular brush layer. However, it is to be appreciated that layer 530 may not be present. In accordance with one embodiment, third regions 526 are shown as formed directly on metal lines 502. However, it is to be appreciated that remnants of a molecular brush layer may be between the third regions 526 and the metal lines 502.

Referring to the cross-sectional view along the c-c' axis of FIG. 5B, the second regions 524 are shown above the metal lines 502, and the first regions 522 are shown above the ILD lines 504. In accordance with one embodiment, also shown between first regions 522 and ILD lines 504 is layer 530 which may be a remnant of a molecular brush layer. However, it is to be appreciated that layer 530 may not be present. In accordance with one embodiment, also shown between second regions 524 and metal lines 502 is layer 532 which may be a remnant of a molecular brush layer. However, it is to be appreciated that layer 532 may not be present. It is also to be appreciated that regions 526 may be formed as photosensitive or may be replaced by a photosensitive material.

Thus, in an embodiment, an underlying metal and ILD grid is recreated in a block copolymer (BCP). This can particularly be so if the BCP pitch is commensurate with the underlying grating pitch. The polymer grid is, in one embodiment, robust against certain small deviations from a perfect grid such. For example, if small plugs effectively place an oxide or like material where a perfect grid would have metal, an essentially perfect block copolymer grid can still be achieved.

In an embodiment, referring again to FIG. 5B, the thickness of the coated with triblock copolymer layer 520 is approximately the same as, or slightly thicker than, the ultimate thickness of an ILD ultimately formed in its place. In an embodiment, as described in greater detail below, the polymer grid is formed not as an etch resist, but rather as scaffolding for ultimately growing a permanent ILD layer there around. As such, the thickness of the with triblock copolymer layer 520 can be important since it may be used to define the ultimate thickness of a subsequently formed permanent ILD layer. That is, in one embodiment, the polymer grating shown in FIG. 5B is eventually replaced with an ILD/metal line grating of roughly the same thickness.

In an embodiment, the triblock copolymer layer 520 molecule is a polymeric molecule formed of a chain of covalently bonded monomers. In a triblock copolymer, there are three different types of monomers, and these different types of monomers are primarily included within different blocks or contiguous sequences of monomers. In an embodiment, the triblock copolymer layer 520 is first applied as an unassembled block copolymer layer portion that includes a block copolymer material applied, e.g., by brush or other coating process. The unassembled aspect refers to scenarios where, at the time of deposition, the block copolymer has not yet substantially phase separated and/or self-assembled to form nanostructures. In this unassembled form, the block polymer molecules are relatively highly randomized, with the different polymer blocks relatively highly randomly oriented and located, which is in contrast to the assembled triblock copolymer layer 520 discussed in association with the resulting structure of FIG. 5B. The unassembled block copolymer layer portion may be applied in a variety of different ways. By way of example, the block copolymer may be dissolved in a solvent and then spin coated over the surface. Alternatively, the unassembled block copolymer may be spray coated, dip coated, immersion coated, or otherwise coated or applied over the surface. Other ways of applying block copolymers, as well as other ways known in the art for applying similar organic coatings, may potentially be used. Then, the unassembled layer may form an assembled block copolymer layer portion, e.g., by microphase separation and/or self-assembly of the unassembled block copolymer layer portion. The microphase separation and/or self-assembly occurs through rearrangement and/or repositioning of the block copolymer molecules, and in particular to rearrangement and/or repositioning of the different polymer blocks of the block copolymer molecules to form triblock copolymer layer 520.

In one such embodiment, an annealing treatment may be applied to the unassembled block copolymer in order to initiate, accelerate, increase the quality of, or otherwise promote microphase separation and/or self-assembly to form triblock copolymer layer 520. In some embodiments, the annealing treatment may include a treatment that is operable to increase a temperature of the block copolymer. One example of such a treatment is baking the layer, heating the layer in an oven or under a thermal lamp, applying infrared radiation to the layer, or otherwise applying heat to or increasing the temperature of the layer. The desired temperature increase will generally be sufficient to significantly accelerate the rate of microphase separation and/or self-assembly of the block polymer without damaging the block copolymer or any other important materials or structures of the integrated circuit substrate. Commonly, the heating may range between about 50° C. to about 300° C., or between about 75° C. to about 250° C., but not exceeding thermal degradation limits of the block copolymer or integrated circuit substrate. The heating or annealing may help to provide energy to the block copolymer molecules to make them more mobile/flexible in order to increase the rate of the microphase separation and/or improve the quality of the microphase separation. Such microphase separation or rearrangement/repositioning of the block copolymer molecules may lead to self-assembly to form extremely small (e.g., nano-scale) structures. The self-assembly may occur under the influence of forces such as surface tension, molecular likes and dislikes, and other surface-related and chemical-related forces.

In any case, in some embodiments, self-assembly of block copolymers, whether based on hydrophobic-hydrophilic differences or otherwise, may be used to form extremely small periodic structures (e.g., precisely spaced nano-scale structures or lines) in the form of triblock copolymer layer 520. In some embodiments, they may be used to form nano-scale lines or other nano-scale structures that can ultimately be used to form via openings. In some embodiments, directed self-assembly of block copolymers may be used to form vias that are self-aligned with interconnects, as described in greater detail below.

It is to be appreciated that the two components of a triblock copolymer structure that are formed above metal lines need not have a 1:1 ratio (a 1:1 ratio was shown in FIGS. 1C and 5B). For example, the third segregated block component may be present in a lesser amount than the second component and may have a columnar structure surrounded by the second segregated block component. FIGS. 6A-6D illustrate plan views and corresponding cross-sectional views representing various operations in a method using triblock copolymers for forming self-aligning vias or contacts for back end of line (BEOL) interconnects, in accordance with an embodiment of the present invention.

Referring to FIG. 6A, a plan view and corresponding cross-sectional view taken along the d-d' axis shows the third component 526 in lesser amount than the second component 524. The third segregated block component 526 has a columnar structure surrounded by the second segregated block component 524.

Referring to FIG. 6B, a plan view shows lithography 650 selection of certain ones 652 of the third segregated block component 526 is performed to ultimately provide via locations for an upper metallization structure.

It is to be appreciated that FIG. 6A effectively illustrates an unexposed photosensitive DSA structure, while FIG. 6B illustrates an exposed photosensitive DSA structure. In contrast to FIG. 5B, FIGS. 6A and 6B demonstrate an example of a columnar structure which may formed when many block copolymer molecules align with their shorter blocks of one of polymer forming columnar structures surrounded by a phase having the longer blocks of another polymer. In accordance with an embodiment of the present invention, the photoactive properties of a DSA structure provides the ability to effectively "plug" or "cut" one type of DSA polymer region with, e.g., e-beam or EUV exposure.

Referring to FIG. 6C, a plan view shows exposed/chemically amplified regions 654 in the zones of exposure. By selectivity, the only active modification is of the material of exposed portions of the third segregated block component 526. It is to be appreciated that, although shown as already cleared in FIG. 6C, the select regions may not yet be cleared.

Referring to FIG. 6D, a plan view and corresponding cross-sectional view taken along the e-e' axis shows post lithographic development to provide cleared regions 654. The cleared regions 654 may ultimately be used for via formation.

The resulting patterned DSA structure of FIG. 6D (or FIG. 1C, 2, 3 or 5B) described above in may ultimately be used as a scaffolding from which permanent layers are ultimately formed. That is, it may be the case that none of the DSA materials exist in a final structure, but rather are used to direct fabrication of a finalized interconnect structure. In one such embodiment, a permanent ILD replaces one or more regions of the DSA material and subsequent processing (such as metal line fabrication) is completed. That is, it is possible that all DSA components ultimately removed for final self-aligned via and plug formation.

With reference again to FIGS. 1A-1C, 5A-5B, and 6A-6D, in an embodiment, a method of fabricating an interconnect structure for a semiconductor die includes forming a lower metallization layer that has alternating metal lines and dielectric lines above a substrate. A triblock copolymer layer is formed above the lower metallization layer. The triblock copolymer layer is segregated to form a first segregated block component over the dielectric lines of the lower metallization layer, and to form alternating second and third segregated block components disposed over the metal lines of the lower metallization layer. The third segregated block component is photosensitive. The method also includes irradiating and developing select locations of the third segregated block component to provide via openings over the metal lines of the lower metallization layer.

In an embodiment, the alternating second and third segregated block components have a ratio of approximately 1:1, as was described in association with FIGS. 1C and 5B. In another embodiment, the alternating second and third segregated block components have a ratio of X:1, second segregated block component to third segregated block component, where X is greater than 1. In that embodiment, the third segregated block component has a columnar structure surrounded by the second segregated block component, as was described in association with FIG. 6A.

In an embodiment, the method further includes, subsequent to irradiating and developing select locations of the third segregated block component to provide the via openings, using the resulting patterned triblock copolymer layer as a scaffolding to form a second level of alternating metal lines and dielectric lines above, coupled to, and orthogonal with the first level of alternating metal lines and dielectric lines. In one embodiment, one or more components of the triblock copolymer layer are retained in the final structure. However, in other embodiments, all components of the triblock copolymer layer are ultimately sacrificial in the sense that none of the material is retained in the final product. An exemplary embodiment of an implementation of the latter embodiment is described below in association with FIG. 7.

In an embodiment, the method further includes, prior to forming the triblock copolymer layer, forming a first molecular brush layer on the dielectric lines of the lower metallization layer, and forming a second, different, molecular brush layer on the metal lines of the lower metallization layer, exemplary embodiments of which were described above in association with FIGS. 1A-1C. In an embodiment, irradiating and developing the select locations of the third segregated block component includes exposing the select locations of the third segregated block component to an extreme ultra-violet (EUV) source or an e-beam source.

Figure 7:
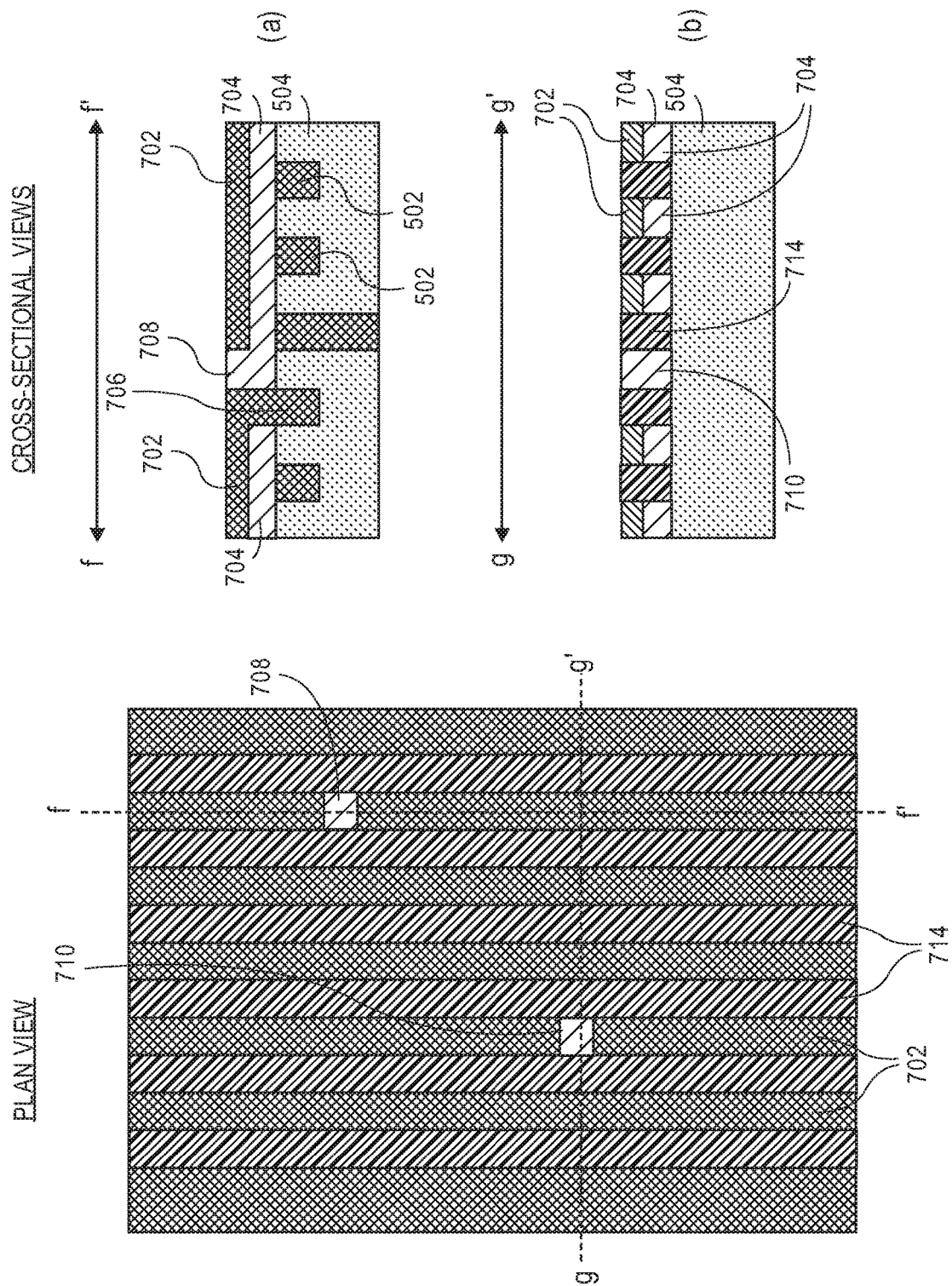
FIG. 7 illustrates a plan view and corresponding cross-sectional views of a self-aligned via structure following metal line, via and plug formation, in accordance with an embodiment of the present invention.

Provided merely as an example of a final structure that may ultimately be obtained, FIG. 7 illustrates a plan view and corresponding cross-sectional views of a self-aligned via structure following metal line, via and plug formation, in accordance with an embodiment of the present invention. Referring to the plan view and corresponding cross-sectional views (a) and (b) taken along axes, f-f and g-g', respectively, an upper level of metal lines 702 is provided in a dielectric framework (e.g., on dielectric layer 704 and adjacent to dielectric lines 714. The metal lines 702 are coupled with underlying metal lines 502 through the predetermined via locations (an example 706 of which is shown in cross-sectional view (a)), and are isolated by plugs (examples of which include plugs 708 and 710). The underlying lines 502 and 504 may be as described above in association with FIG. 5A, as formed in a direction orthogonal to the metal lines 702. It is to be appreciated that, in subsequent fabrication operations, the dielectric lines 714 may be removed to provide air gaps between the resulting metal lines 702.

A resulting structure such as that described in association with FIG. 7 may subsequently be used as a foundation for forming subsequent metal line/via and ILD layers. Alternatively, the structure of FIG. 7 may represent the final metal interconnect layer in an integrated circuit. It is to be appreciated that the above process operations may be practiced in alternative sequences, not every operation need be performed and/or additional process operations may be performed. In any case, the resulting structures enable fabrication of vias that are directly centered on underlying metal lines. That is, the vias may be wider than, narrower than, or the same thickness as the underlying metal lines, e.g., due to non-perfect selective etch processing. Nonetheless, in an embodiment, the centers of the vias are directly aligned (match up) with the centers of the metal lines. As such, in an embodiment, offset due to conventional lithograph/dual damascene patterning that must otherwise be tolerated, is not a factor for the resulting structures described herein. It is to be appreciated that the above examples have focused on via/contact formation. However, in other embodiments, similar approaches may be used to preserve or form regions for line end termination (plugs) within a metal line layer.

To provide further context for the above described embodiments, patterning and aligning of features at less than approximately 50 nanometer pitch requires many reticles and critical alignment strategies that are extremely expensive for a semiconductor manufacturing process. Generally, embodiments described herein involve the fabrication of metal and via patterns based on the positions of an underlying layer. That is, in contrast to conventional top-down patterning approaches, a metal interconnect process is effectively reversed and built from the previous layer up. This is in contrast to a conventional approach such as dual damascene metallization where an interlayer dielectric (ILD) is first deposited, with a pattern for metal and via layers subsequently patterned therein. In the conventional approach, alignment to a previous layer is performed using a lithography scanner alignment system. The ILD is then etched.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 8:
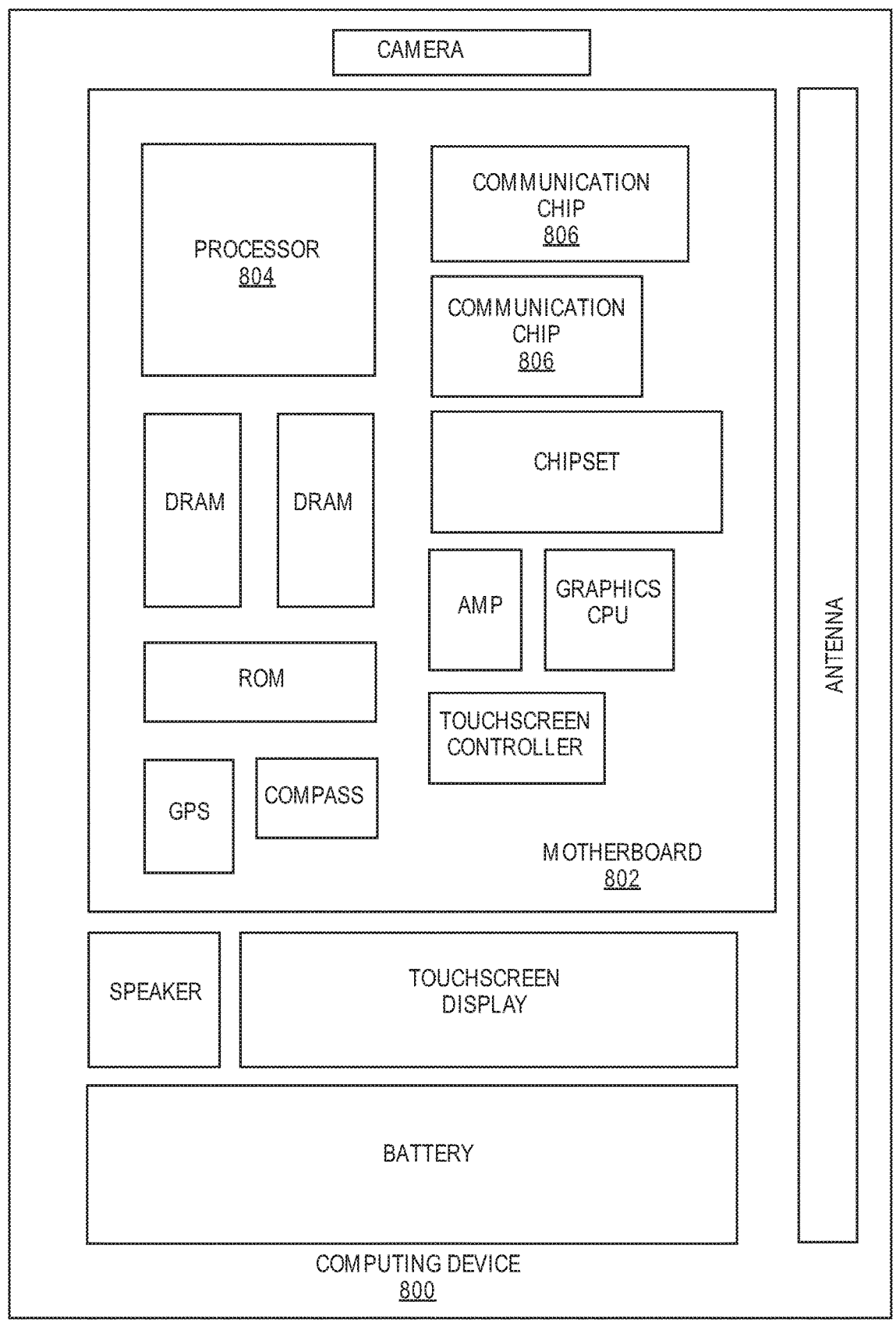
FIG. 8 illustrates a computing device in accordance with one implementation of an embodiment of the invention.

FIG. 8 illustrates a computing device 800 in accordance with one implementation of the invention. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the invention, the integrated circuit die of the processor includes one or more structures, such as self-aligned vias or plugs, built in accordance with implementations of embodiments of the invention. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of the invention, the integrated circuit die of the communication chip includes one or more structures, such as self-aligned vias or plugs, built in accordance with implementations of embodiments of the invention.

In further implementations, another component housed within the computing device 800 may contain an integrated circuit die that includes one or more structures, such as self-aligned vias or plugs, built in accordance with implementations of embodiments of the invention.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Figure 9:
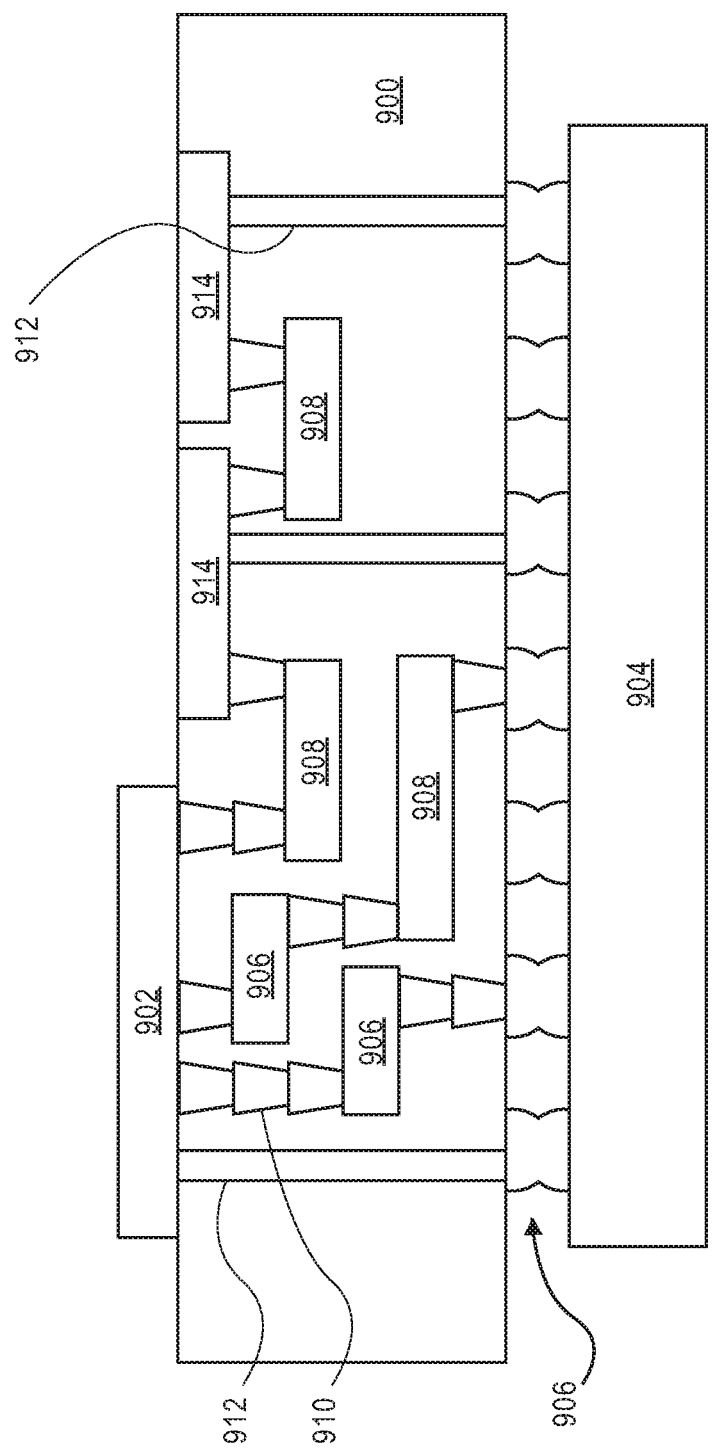
FIG. 9 is an interposer implementing one or more embodiments of the invention.

FIG. 9 illustrates an interposer 900 that includes one or more embodiments of the invention. The interposer 900 is an intervening substrate used to bridge a first substrate 902 to a second substrate 904. The first substrate 902 may be, for instance, an integrated circuit die. The second substrate 904 may be, for instance, a memory module, a computer motherboard, or another integrated circuit die. Generally, the purpose of an interposer 900 is to spread a connection to a wider pitch or to reroute a connection to a different connection. For example, an interposer 900 may couple an integrated circuit die to a ball grid array (BGA) 906 that can subsequently be coupled to the second substrate 904. In some embodiments, the first and second substrates 902/904 are attached to opposing sides of the interposer 900. In other embodiments, the first and second substrates 902/904 are attached to the same side of the interposer 900. And in further embodiments, three or more substrates are interconnected by way of the interposer 900.

The interposer 900 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 908 and vias 910, including but not limited to through-silicon vias (TSVs) 912. The interposer 900 may further include embedded devices 914, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 900. In accordance with embodiments of the invention, apparatuses or processes disclosed herein may be used in the fabrication of interposer 900.

Thus, embodiments of the present invention include fabrication schemes based on triblock copolymers for forming self-aligning vias or contacts for back end of line (BEOL) interconnects, and the resulting structures.

In an embodiment, a structure for directed self-assembly of a back end of line (BEOL) semiconductor structure metallization layer includes a substrate. A lower metallization layer including alternating metal lines and dielectric lines disposed above the substrate. A triblock copolymer layer is disposed above the lower metallization layer. The triblock copolymer layer includes a first segregated block component disposed over the dielectric lines of the lower metallization layer, and alternating second and third segregated block components disposed over the metal lines of the lower metallization layer. The third segregated block component is photosensitive.

In one embodiment, the structure further includes a first molecular brush layer disposed on the dielectric lines of the lower metallization layer. The first segregated block component is disposed on the first molecular brush layer. The structure also includes a second, different, molecular brush layer disposed on the metal lines of the lower metallization layer. The alternating second and third segregated block components are disposed on the second molecular brush layer.

In one embodiment, the first molecular brush layer includes polystyrene with a head group selected from the group consisting of —SH, —PO$_3$H$_2$, —CO$_2$H, —NRH, —NRR', and —Si(OR)$_3$, and the second molecular brush layer includes polymethacrylate with a head group selected from the group consisting of —SH, —PO$_3$H$_2$, —CO$_2$H, —NRH, —NRR', and —Si(OR)$_3$.

In one embodiment, the triblock copolymer layer includes a triblock copolymer species selected from the group consisting of any three of poly-styrene and other polyvinylarenes, polyisoprene and other polyolefins, poly-methacrylate and other poly-esters, polydimethylsiloxane (PDMS) and related Si-based polymers, polyferrocenylsilanes, polyethylene oxide (PEO) and related poly-ethers and poly-vinylpyridine.

In one embodiment, the alternating second and third segregated block components have a ratio of approximately 1:1.

In one embodiment, the alternating second and third segregated block components have a ratio of X:1, second segregated block component to third segregated block component, where X is greater than 1, and where the third segregated block component has a columnar structure surrounded by the second segregated block component.

In one embodiment, the alternating metal lines and dielectric lines of the lower metallization layer have a grating pattern with a constant pitch.

In one embodiment, the third segregated block component of the triblock copolymer layer defines all possible via locations for a metallization layer above the lower metallization layer.

In one embodiment, the third segregated block component of the triblock copolymer layer is photosensitive to an extreme ultra-violet (EUV) source or an e-beam source.

In an embodiment, a method of fabricating an interconnect structure for a semiconductor die includes forming a lower metallization layer including alternating metal lines and dielectric lines above a substrate. The method also includes forming a triblock copolymer layer above the lower metallization layer. The method also includes segregating the triblock copolymer layer to form a first segregated block component over the dielectric lines of the lower metallization layer, and to form alternating second and third segregated block components disposed over the metal lines of the lower metallization layer, where the alternating second and third segregated block components have a ratio of approximately 1:1, and where the third segregated block component is photosensitive. The method also includes irradiating and developing select locations of the third segregated block component to provide via openings over the metal lines of the lower metallization layer.

In one embodiment, the method further includes, subsequent to irradiating and developing select locations of the third segregated block component to provide the via openings, using the resulting patterned triblock copolymer layer as a scaffolding to form a second level of alternating metal lines and dielectric lines above, coupled to, and orthogonal with the first level of alternating metal lines and dielectric lines.

In one embodiment, the method further includes, prior to forming the triblock copolymer layer, forming a first molecular brush layer on the dielectric lines of the lower metallization layer, and forming a second, different, molecular brush layer on the metal lines of the lower metallization layer.

In one embodiment, forming the first molecular brush layer includes providing a polystyrene with a head group selected from the group consisting of —SH, —PO$_3$H$_2$, —CO$_2$H, —NRH, —NRR', and —Si(OR)$_3$ on the dielectric lines of the lower metallization layer, and forming the second molecular brush layer includes providing polymethacrylate with a head group selected from the group consisting of —SH, —PO$_3$H$_2$, —CO$_2$H, —NRH, —NRR', and —Si(OR)$_3$ on the metal lines of the lower metallization layer.

In one embodiment, forming the triblock copolymer layer includes providing a triblock copolymer species selected from the group consisting of any three of poly-styrene and other polyvinylarenes, polyisoprene and other polyolefins, poly-methacrylate and other poly-esters, polydimethylsiloxane (PDMS) and related Si-based polymers, polyferrocenylsilanes, polyethyelene oxide (PEO) and related polyethers and poly-vinylpyridine.

In one embodiment, forming the alternating metal lines and dielectric lines of the lower metallization layer includes forming a grating pattern having a constant pitch.

In one embodiment, irradiating and developing the select locations of the third segregated block component includes exposing the select locations of the third segregated block component to an extreme ultra-violet (EUV) source or an e-beam source.

In an embodiment, a method of fabricating an interconnect structure for a semiconductor die includes forming a lower metallization layer including alternating metal lines and dielectric lines above a substrate. The method also includes forming a triblock copolymer layer above the lower metallization layer. The method also includes segregating the triblock copolymer layer to form a first segregated block component over the dielectric lines of the lower metallization layer, and to form alternating second and third segregated block components disposed over the metal lines of the lower metallization layer, where the alternating second and third segregated block components have a ratio of X:1, second segregated block component to third segregated block component, where X is greater than 1, where the third segregated block component has a columnar structure surrounded by the second segregated block component, and where the third segregated block component is photosensitive. The method also includes irradiating and developing select locations of the third segregated block component to provide via openings over the metal lines of the lower metallization layer.

In one embodiment, the method further includes, subsequent to irradiating and developing select locations of the third segregated block component to provide the via openings, using the resulting patterned triblock copolymer layer as a scaffolding to form a second level of alternating metal lines and dielectric lines above, coupled to, and orthogonal with the first level of alternating metal lines and dielectric lines.

In one embodiment, the method further includes, prior to forming the triblock copolymer layer, forming a first molecular brush layer on the dielectric lines of the lower metallization layer, and forming a second, different, molecular brush layer on the metal lines of the lower metallization layer.

In one embodiment, forming the first molecular brush layer includes providing polystyrene with a head group selected from the group consisting of —SH, —PO$_3$H$_2$, —CO$_2$H, —NRH, —NRR', and —Si(OR)$_3$ on the dielectric lines of the lower metallization layer, and forming the second molecular brush layer includes providing polymethacrylate with a head group selected from the group consisting of —SH, —PO$_3$H$_2$, —CO$_2$H, —NRH, —NRR', and —Si(OR)$_3$ on the metal lines of the lower metallization layer.

In one embodiment, forming the triblock copolymer layer includes providing a triblock copolymer species selected from the group consisting of any three of poly-styrene and other polyvinylarenes, polyisoprene and other polyolefins, poly-methacrylate and other poly-esters, polydimethylsiloxane (PDMS) and related Si-based polymers, polyferrocenylsilanes, polyethyelene oxide (PEO) and related polyethers and poly-vinylpyridine.

In one embodiment, forming the alternating metal lines and dielectric lines of the lower metallization layer includes forming a grating pattern having a constant pitch.

In one embodiment, irradiating and developing the select locations of the third segregated block component includes exposing the select locations of the third segregated block component to an extreme ultra-violet (EUV) source or an e-beam source.

What is claimed is:
1. A structure for directed self-assembly of a back end of line (BEOL) semiconductor structure metallization layer, the structure comprising:
   a substrate;
   a lower metallization layer comprising alternating metal lines and dielectric lines disposed above the substrate;
   a triblock copolymer layer disposed above the lower metallization layer and comprising:
      a first segregated block component disposed over the dielectric lines of the lower metallization layer; and
      alternating second and third segregated block components disposed over the metal lines of the lower metallization layer, wherein the second segregated block component has a different chemical composition than the first segregated block component, and the third segregated block component has a different chemical composition than the first and second segregated block components, and wherein the third segregated block component is photosensitive.

2. The structure of claim 1, further comprising:
a first molecular brush layer disposed on the dielectric lines of the lower metallization layer, wherein the first segregated block component is disposed on the first molecular brush layer; and
a second, different, molecular brush layer disposed on the metal lines of the lower metallization layer, wherein the alternating second and third segregated block components are disposed on the second molecular brush layer.

3. The structure of claim 2, wherein the first molecular brush layer comprises polystyrene with a head group selected from the group consisting of —SH, —PO$_3$H$_2$, —CO$_2$H, —NRH, —NRR', and —Si(OR)$_3$, and wherein the second molecular brush layer comprises polymethacrylate with a head group selected from the group consisting of —SH, —PO$_3$H$_2$, —CO$_2$H, —NRH, —NRR', and —Si(OR)$_3$.

4. The structure of claim 1, wherein the triblock copolymer layer comprises a triblock copolymer species selected from the group consisting of any three of poly-styrene and other polyvinylarenes, polyisoprene and other polyolefins, poly-methacrylate and other poly-esters, polydimethylsiloxane (PDMS) and related Si-based polymers, polyferrocenylsilanes, polyethyelene oxide (PEO) and related poly-ethers and poly-vinylpyridine.

5. The structure of claim 1, wherein the alternating second and third segregated block components have a ratio of approximately 1:1.

6. The structure of claim 1, wherein the alternating second and third segregated block components have a ratio of X:1, second segregated block component to third segregated block component, wherein X is greater than 1, and wherein the third segregated block component has a columnar structure surrounded by the second segregated block component.

7. The structure of claim 1, wherein the alternating metal lines and dielectric lines of the lower metallization layer have a grating pattern with a constant pitch.

8. The structure of claim 1, wherein the third segregated block component of the triblock copolymer layer defines all possible via locations for a metallization layer above the lower metallization layer.

9. The structure of claim 1, wherein the third segregated block component of the triblock copolymer layer is photosensitive to an extreme ultra-violet (EUV) source or an e-beam source.

10. A structure for directed self-assembly of a back end of line (BEOL) semiconductor structure metallization layer, the structure comprising:
a substrate;
a lower metallization layer comprising alternating metal lines and dielectric lines disposed above the substrate;
a triblock copolymer layer disposed above the lower metallization layer and comprising:
a first molecular brush layer disposed on the dielectric lines of the lower metallization layer;
a first segregated block component disposed over the dielectric lines of the lower metallization layer, the first segregated block component disposed on the first molecular brush layer;
a second, different, molecular brush layer disposed on the metal lines of the lower metallization layer; and
alternating second and third segregated block components disposed over the metal lines of the lower metallization layer, the alternating second and third segregated block components disposed on the second molecular brush layer, wherein the third segregated block component is photosensitive.

11. The structure of claim 10, wherein the first molecular brush layer comprises polystyrene with a head group selected from the group consisting of —SH, —PO$_3$H$_2$, —CO$_2$H, —NRH, —NRR', and —Si(OR)$_3$, and wherein the second molecular brush layer comprises polymethacrylate with a head group selected from the group consisting of —SH, —PO$_3$H$_2$, —CO$_2$H, —NRH, —NRR', and —Si(OR)$_3$.

12. A method of fabricating an interconnect structure for a semiconductor die, the method comprising:
forming a lower metallization layer comprising alternating metal lines and dielectric lines above a substrate;
forming a triblock copolymer layer above the lower metallization layer;
segregating the triblock copolymer layer to form a first segregated block component over the dielectric lines of the lower metallization layer, and to form alternating second and third segregated block components disposed over the metal lines of the lower metallization layer, wherein the second segregated block component has a different chemical composition than the first segregated block component, and the third segregated block component has a different chemical composition than the first and second segregated block components, wherein the alternating second and third segregated block components have a ratio of X:1, second segregated block component to third segregated block component, wherein X is greater than 1, wherein the third segregated block component has a columnar structure surrounded by the second segregated block component, and wherein the third segregated block component is photosensitive; and
irradiating and developing select locations of the third segregated block component to provide via openings over the metal lines of the lower metallization layer.

13. The method of claim 12, further comprising:
subsequent to irradiating and developing select locations of the third segregated block component to provide the via openings, using the segregated triblock copolymer layer as a scaffolding to form a second level of alternating metal lines and dielectric lines above, coupled to, and orthogonal with the first level of alternating metal lines and dielectric lines.

14. The method of claim 12, further comprising:
prior to forming the triblock copolymer layer, forming a first molecular brush layer on the dielectric lines of the lower metallization layer; and
forming a second, different, molecular brush layer on the metal lines of the lower metallization layer.

15. The method of claim 14, wherein forming the first molecular brush layer comprises providing a polystyrene with a head group selected from the group consisting of —SH, —PO$_3$H$_2$, —CO$_2$H, —NRH, —NRR', and —Si(OR)$_3$ on the dielectric lines of the lower metallization layer, and wherein forming the second molecular brush layer comprises providing polymethacrylate with a head group selected from the group consisting of —SH, —PO$_3$H$_2$, —CO$_2$H, —NRH, —NRR', and —Si(OR)$_3$ on the metal lines of the lower metallization layer.

16. The method of claim 12, wherein forming the triblock copolymer layer comprises providing a triblock copolymer species selected from the group consisting of any three of poly-styrene and other polyvinylarenes, polyisoprene and other polyolefins, poly-methacrylate and other poly-esters, polydimethylsiloxane (PDMS) and related Si-based polymers, polyferrocenylsilanes, polyethyelene oxide (PEO) and related poly-ethers and poly-vinylpyridine.

17. The method of claim 12, wherein forming the alternating metal lines and dielectric lines of the lower metallization layer comprises forming a grating pattern having a constant pitch.

18. The method of claim 12, wherein irradiating and developing the select locations of the third segregated block component comprises exposing the select locations of the third segregated block component to an extreme ultra-violet (EUV) source or an e-beam source.

19. A method of fabricating an interconnect structure for a semiconductor die, the method comprising:

forming a lower metallization layer comprising alternating metal lines and dielectric lines above a substrate;

forming a first molecular brush layer on the dielectric lines of the lower metallization layer;

forming a second, different, molecular brush layer on the metal lines of the lower metallization layer;

subsequent to forming the first molecular brush layer and the second molecular brush layer, forming a triblock copolymer layer above the lower metallization layer;

segregating the triblock copolymer layer to form a first segregated block component over the dielectric lines of the lower metallization layer, and to form alternating second and third segregated block components disposed over the metal lines of the lower metallization layer, wherein the alternating second and third segregated block components have a ratio of X:1, second segregated block component to third segregated block component, wherein X is greater than 1, wherein the third segregated block component has a columnar structure surrounded by the second segregated block component, and wherein the third segregated block component is photosensitive; and irradiating and developing select locations of the third segregated block component to provide via openings over the metal lines of the lower metallization layer.

20. The method of claim 19, wherein forming the first molecular brush layer comprises providing a polystyrene with a head group selected from the group consisting of $-SH$, $-PO_3H_2$, $-CO_2H$, $-NRH$, $-NRR'$, and $-Si(OR)_3$ on the dielectric lines of the lower metallization layer, and wherein forming the second molecular brush layer comprises providing polymethacrylate with a head group selected from the group consisting of $-SH$, $-PO_3H_2$, $-CO_2H$, $-NRH$, $-NRR'$, and $-Si(OR)_3$ on the metal lines of the lower metallization layer.

* * * * *